United States Patent
Kalafala et al.

(10) Patent No.: US 7,117,466 B2
(45) Date of Patent: Oct. 3, 2006

(54) SYSTEM AND METHOD FOR CORRELATED PROCESS PESSIMISM REMOVAL FOR STATIC TIMING ANALYSIS

(75) Inventors: Kerim Kalafala, Rhinebeck, NY (US); Peihua Qi, Wappingers Falls, NY (US); David J. Hathaway, Underhill Center, VT (US); Alexander J. Suess, Hopewell Junction, NY (US); Chandramouli Visweswariah, Croton-on-Hudson, NY (US)

(73) Assignee: International Business Machines Corporation, Armonk, NY (US)

(*) Notice: Subject to any disclaimer, the term of this patent is extended or adjusted under 35 U.S.C. 154(b) by 328 days.

(21) Appl. No.: 10/665,273

(22) Filed: Sep. 18, 2003

(65) Prior Publication Data

US 2005/0066297 A1 Mar. 24, 2005

(51) Int. Cl.
G06F 17/50 (2006.01)
(52) U.S. Cl. .............................. 716/6; 716/4
(58) Field of Classification Search ................ 716/1, 716/4–6, 8, 2, 18
See application file for complete search history.

(56) References Cited

U.S. PATENT DOCUMENTS

| | | | | |
|---|---|---|---|---|
| 5,636,372 A | * | 6/1997 | Hathaway et al. ......... | 713/500 |
| 5,790,435 A | * | 8/1998 | Lewis et al. ............... | 716/6 |
| 6,604,227 B1 | * | 8/2003 | Foltin et al. ............... | 716/6 |
| 6,615,395 B1 | * | 9/2003 | Hathaway et al. ......... | 716/6 |
| 6,799,308 B1 | * | 9/2004 | You et al. .................. | 716/6 |
| 6,845,494 B1 | * | 1/2005 | Burks et al. ............... | 716/6 |
| 2004/0230929 A1 | * | 11/2004 | Zhou et al. ................. | 716/6 |
| 2005/0066296 A1 | * | 3/2005 | Visweswariah ............. | 716/6 |

* cited by examiner

Primary Examiner—Thuan Do
Assistant Examiner—Binh Tat
(74) Attorney, Agent, or Firm—H. Daniel Schnurmann

(57) ABSTRACT

A method of removing pessimism in static timing analysis is described. Delays are expressed as a function of discrete parameter settings allowing for both local and global variation to be taken in to account. Based on a specified target slack, each failing timing test is examined to determine a consistent set of parameter settings which produces the worst possible slack. The analysis is performed on a path basis. By considering only parameters which are in common to a particular data/clock path-pair, the number of process combinations that need to be explored is reduced when compared to analyzing all combinations of the global parameter settings. Further, if parameters are separable and linear, worst-case variable assignments for a particular clock/data path pair can be computed in linear time by independently assigning each parameter value. In addition, if available, the incremental delay change with respect to each physically realizable process variable may be used to project the worst-case variable assignment on a per-path basis without the need for performing explicit corner enumeration.

28 Claims, 7 Drawing Sheets

Fig. 4

|  | V | | W | | X | | Y | | Z | |
|---|---|---|---|---|---|---|---|---|---|---|
|  | Max | Min | Max | Min | Max | Min | Max | Min | Max | Min |
| BOX 300 | 10 | 5 |  |  |  |  |  |  |  |  |
| BOX 310 |  |  | 20 | 10 |  |  |  |  |  |  |
| BOX 320 |  |  |  |  | 10 | 5 | 20 | 10 |  |  |
| BOX 330 |  |  | 30 | 25 |  |  |  |  | 10 | 5 |
| BOX 340 |  |  |  |  | 20 | 10 |  |  | 20 | 10 |
| BOX 350 | 5 | 0 |  |  |  |  | 10 | 5 |  |  |
| BOX 360 | 55 | 30 |  |  |  |  |  |  |  |  |

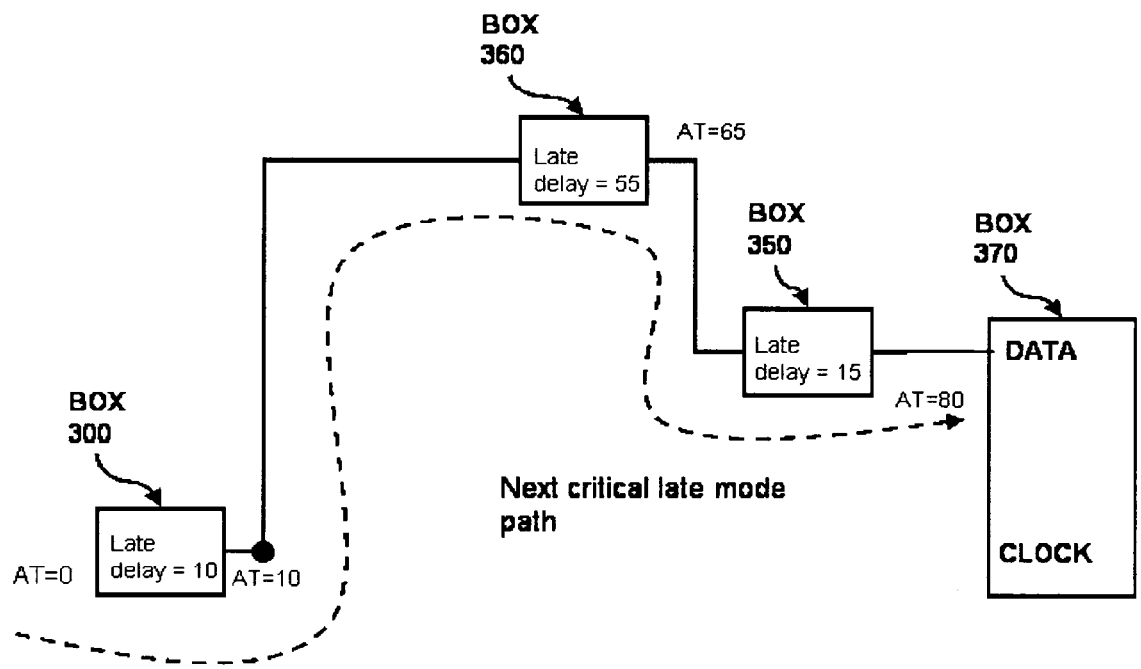

SYSTEM AND METHOD FOR CORRELATED PROCESS PESSIMISM REMOVAL FOR STATIC TIMING ANALYSIS

BACKGROUND OF THE INVENTION

The invention is related to the field of Electronic Design Automation, and more specifically, to a method of reducing pessimism in static timing analysis when considering variation effects on the circuit delay.

Static timing is used widely in order to verify the timing of digital integrated circuit designs by calculating delays and propagating signal arrival times to determine the interval in which signals will be stable within a single clock cycle. In particular, for internal storage elements, the latest (earliest) arrival time data propagated along a data path is compared against the earliest (latest) arrival time propagated along a clock path to identify potential setup (hold) violations. The difference between the data and clock path arrival times, including the setup or hold time of the sequential element is referred to as 'slack.' This difference is computed so that a negative slack value signals a timing violation. For a setup constraint, if the minimum (or early) clock arrival time minus the maximum (or late) data arrival time is negative, the data may still become unstable following the occurrence of a clock transition, thus preventing the correct data from being stored in the storage element. Similarly, for a hold constraint, if the minimum (or early) data arrival time minus the maximum (or late) clock arrival time is negative, the data may still become unstable before the occurrence of a clock transition, again preventing the correct data from being stored in the storage element. The comparison of two timing values (generally early and late) converging at a circuit element (e.g., a latch) is referred to as a timing test.

Circuit delays may be affected by a wide variety of parameters, broadly categorized as either manufacturing (either front or back end of line), environmental (e.g., voltage, temperature), reliability (e.g., transistor performance degradation over product lifetime), or model uncertainty (e.g., on a cell-type basis). As critical process dimensions continue to shrink, timing variability increases as a fraction of the overall design cycle time. In addition, new technology features, such as the ability to independently scale voltages for different subsections of the design for power management purposes, increase the number of independent parameters that need to be considered to achieve an accurate timing analysis. Also, the increase in the fraction of wire delay along critical paths makes the variability of each metal layer essential to consider.

In general, it is not possible to determine a priori which combination of parameter settings will produce the most critical timing. Furthermore, delays may not be monotonic in all parameters, so that for different paths across a chip, different parameter assignments may be required to generate the latest (earliest) possible path delays. For example, when considering variability in wire thickness, it is assumed that thin wires generally create the latest arrival time for wire-delay dominated paths due to increased wire resistance, whereas paths which are gate-delay dominated will typically exhibit longer delays when thick wiring is considered, due to increased wire capacitance loading of gates.

Existing design automation tools and methodologies require an exhaustive search of all possible parameter combinations in order to guarantee a true worst-case coverage. However, given the increasing number of independent parameters that have a significant impact on delay, such an approach is fast becoming impractical.

One alternative to this exhaustive analysis is to bound the problem by computing late delays/arrival times assuming the slowest possible conditions, and simultaneously assuming the fastest conditions for early delays/arrival times. This is called a "bounding method" or a "bounded timing analysis, and the early and late delays and the parameters used in their computation within the analysis are called "bounded" values. While this guarantees worst-case coverage (i.e., that all potential timing errors will be detected) without the need for multiple analyses, such an approach typically leads to overly pessimistic results since correlation is not properly accounted for. By way of example, for internal timing constraints, it can easily lead to comparing a late mode data path which assumes, for instance, a low supply voltage, against an early mode clock path where a high supply voltage was assumed. If the design only contains a single power supply source, the assumption is deemed to be inconsistent and pessimistic since the circuits cannot operate simultaneously at two different power supply voltages (Note: this example ignores across-chip IR drop effects.) The over-conservative nature of bounding techniques often precludes their practical use, forcing circuit designers to explicitly perform multiple analyses as described above.

In the special case where the clock and data paths share common circuits, a method of removing the common path pessimism is described in U.S. Pat. No. 5,636,372 to D. J. Hathaway et al., "Network timing analysis method which eliminates timing variations between signals traversing a common circuit path," which reduces the pessimism of the bounding method by tracing the paths contributing to a failing test, i.e., one having a negative slack, and adding to that slack the difference between the bounding early and late mode delays of cells in the common portion of the path. However, the method described cannot remove pessimism due to paths that do not physically share the same cells, but which are dependent on the same underlying varying parameters.

SUMMARY AND OBJECTS OF THE INVENTION

Accordingly, it is an object of the invention to provide a method for reducing the pessimism of bounded static timing analysis in the presence of variation caused by one or more sources of uncertainty.

It is another object to remove pessimism in cases where clock and data paths which are compared at a test depend on one or more of the same global sources of variation.

It is a further object of the invention to account for both wire and cell delay variation.

It is yet another object of the invention to account for variation which includes both global and local components.

These and other objects are achieved by a system and method that eliminates timing variations between signals traversing paths, and which are affected by the same sources of variation.

Delays are expressed as a function of discrete parameter settings allowing local and global variation components to be taken into account, wherein local components are defined as those that vary between cells on the same chip, in contrast with global components which vary consistently across the entire chip. Examples of local variation include IR drop in the power supply voltage or ACLV (Across Chip Linewidth Variation), whereas examples of global variation include metal thickness and mistrack between NFET and PFET characteristics. Accordingly, the delay or slew (rise/fall time) of each cell or wire is calculated with respect to parameters showing variations such that the Delay due to a parameter $X=D(X\_Global+X\_Local)$.

Based on a specified target slack, each failing test is examined to determine a consistent set of parameter settings which produces the worst possible slack. The analysis is performed on a path basis. By considering only parameters which are common to a particular data/clock path pair, the number of process combinations that need to be explored is reduced (as compared to analyzing all combinations of global parameters sequentially). Further, if functions of the parameters are separable and linear, the worst case variable assignments for a particular clock/data path pair can be computed in linear time by independently assigning each parameter value.

The present invention provided a method for performing static timing analysis of a digital system in the presence of a plurality of global sources of delay variation, the method including the steps of: a) selecting, for at least one timing test, at least one pair of an early path and a late path leading to the timing test; b) identifying at least one global parameter which the delays of the early and late paths depend on; c) determining for at least one of the global parameters at least one consistent value assignment; and d) computing for each consistent assignment a slack value for the path pair.

BRIEF DESCRIPTION OF THE DRAWINGS

The accompanying drawings, which are incorporated in and which constitute part of the specification, illustrate presently preferred embodiments of the invention and, together with the general description given above and the detailed description of the preferred embodiments given below, serve to explain the principles of the invention.

FIG. 4 is a table of circuit delays as a function of global parameters for the aforementioned illustrative circuit shown in FIG. 3.

FIG. 7 illustrates the bounded late mode arrival times for the next critical data path in the aforementioned circuit.

DETAILED DESCRIPTION OF THE INVENTION

Figure 1:
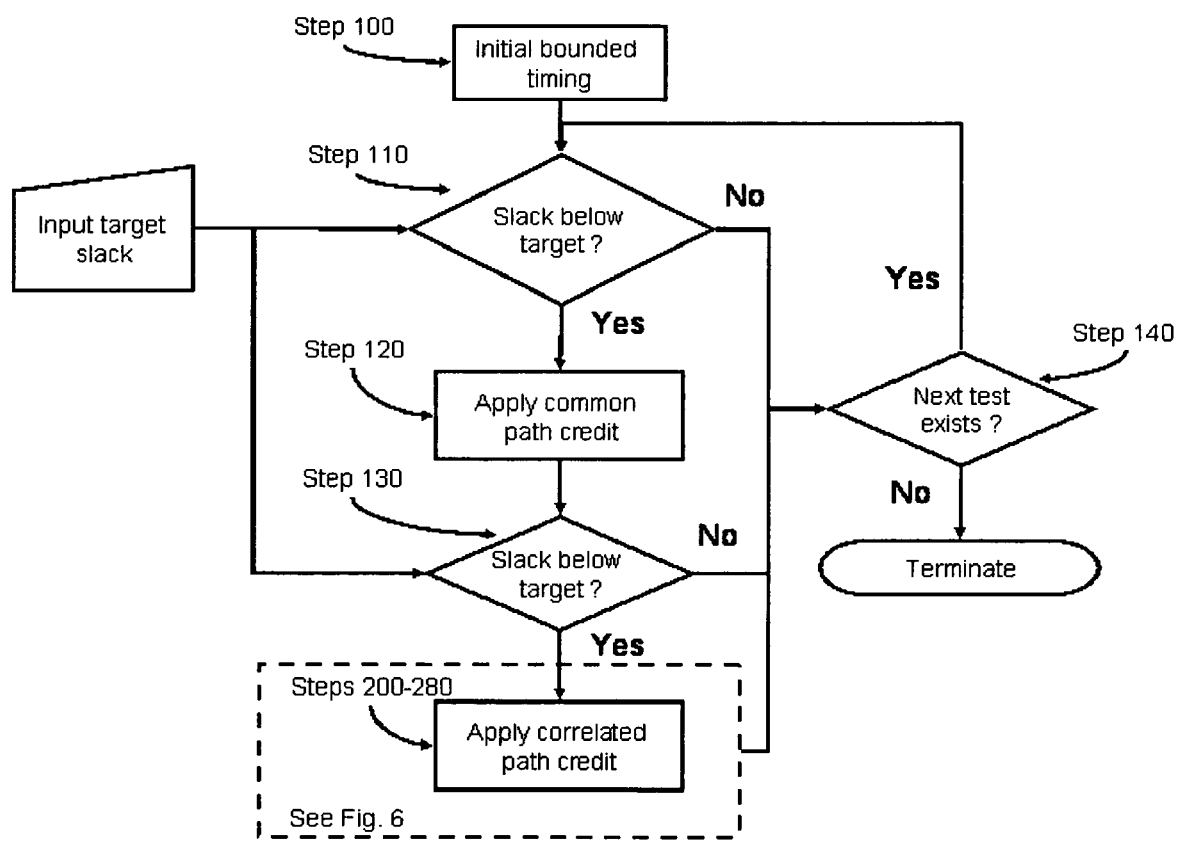
FIG. 1 is an overview of the method in accordance with the present invention.

In the method of the present invention, delays and slews are expressed as functions of parameters which show variations. For each timing test, the worst slack among all consistent global variable assignments is determined. By way of example, if a design is characterized by having two supply Vdd voltages, Vdd1 and Vdd2, what is required is to select the worst combinations between (Vdd1 min, Vdd2 min), (Vdd1 min, Vdd2 max), (Vdd1 max, Vdd2 min) and (Vdd1 max, Vdd2 max). More generally, the value of any parameter v influencing the delays and slews of any two blocks x and y can be expressed as vx=vglobal+vxlocal and vy=vglobal+vylocal, that is, there is a common component to the variation in the two values of v, as well as a local variation component. For example, if the parameter of interest is power supply voltage, since delay decreases with increasing voltage, the bounding method (also referred to as worst-case analysis) compares the delays of an early path including block x and a late path including block y, using $vx=v\text{global\_max}+vx\text{local\_max}$ and $vy=v\text{global\_min}+vy\text{local\_min}$.

To remove the pessimism, consistent values of vglobal, but independent values of vxlocal and vylocal are considered. That is, consistent assignments require comparing $vx=v\text{global\_max}+vx\text{local\_max}$ with
$vy=v\text{global\_max}+vy\text{local\_min}$, or comparing $vx=v\text{global\_min}+vx\text{local\_max}$ with $vy=v\text{global\_min}+vy\text{local\_min}$.

Parameters that affect delay in linear fashion require only minimum and maximum extremes to capture the worst possible slack value, since the linear delay functions will produce a linear slack function and, thus, the extreme slack can be shown to occur always at one of the extremes. For more complicated delay functions, additional settings may be used to improve accuracy.

In general, any given delay in the circuit may be a function of multiple parameters Delay (block $X$)=$D$ ($A$global+$A$local, $B$global+$B$local, ..., $N$global+$N$local)

In the method of the present invention, in order to remove pessimism, some parameters may be left with the bounded values, while others are expressed in terms of corners. A corner for a parameter is defined as a consistent assignment of the parameter value in computation of both early and late mode delays. For example, consider early and late delays de and dl which are functions of parameters p1 and p2, each with global and local variations. For illustrative purposes, it is assumed that the delay functions de and dl are separable in parameters p1 and p2, which leads to $de=de0+de1(p1)+de2(p2)$ and $dl=dl0+dl1(p1)+dl2(p2)$.

It is further assumed that delay is a decreasing function of both parameters p1 and p2, similar to the dependence of delay on the power supply voltage. Then, an analysis can be performed using full variation of parameter p1 and corners for parameter p2, i.e., bounding on p1 and full corner enumeration on p2. This entails first comparing:

$de=de0+de1(p1\ \text{global\_max}+p1\ \text{local\_max})+de2(p2\ \text{global\_max}+p2\ \text{local\_max})$ with $dl=dl0+dl1(p1\text{global\_min}+p1\text{local\_min})+dl2(p2\text{global\_max}+p2\text{local\_min})$, and then comparing $de=de0+de1(p1\text{global\_max}+p1\text{local\_max})+de2(p2\text{global\_min}+p2\text{local\_max})$, with $dl=dl0+dl1(p1\text{global\_min}+p1\text{local\_min})+dl2(p2\text{global\_min}+p2\text{local\_min})$.

Assuming that select delays and slews are expressed in this manner, and that an initial bounded timing analysis as described above was performed, we now refer to FIG. 1 that shows an overview of the method of the present invention. Pessimism is removed for tests where both the clock and data paths are dependent on at least one common underlying parameter.

In step 100, an initial timing is performed with all parameters in their bounded state, i.e., the slowest possible conditions are assumed for late mode timing, while the fastest possible conditions are used for early mode analysis. This step is intended to identify potential violations for which further analysis is required, as indicated in step 110.

Figure 3:
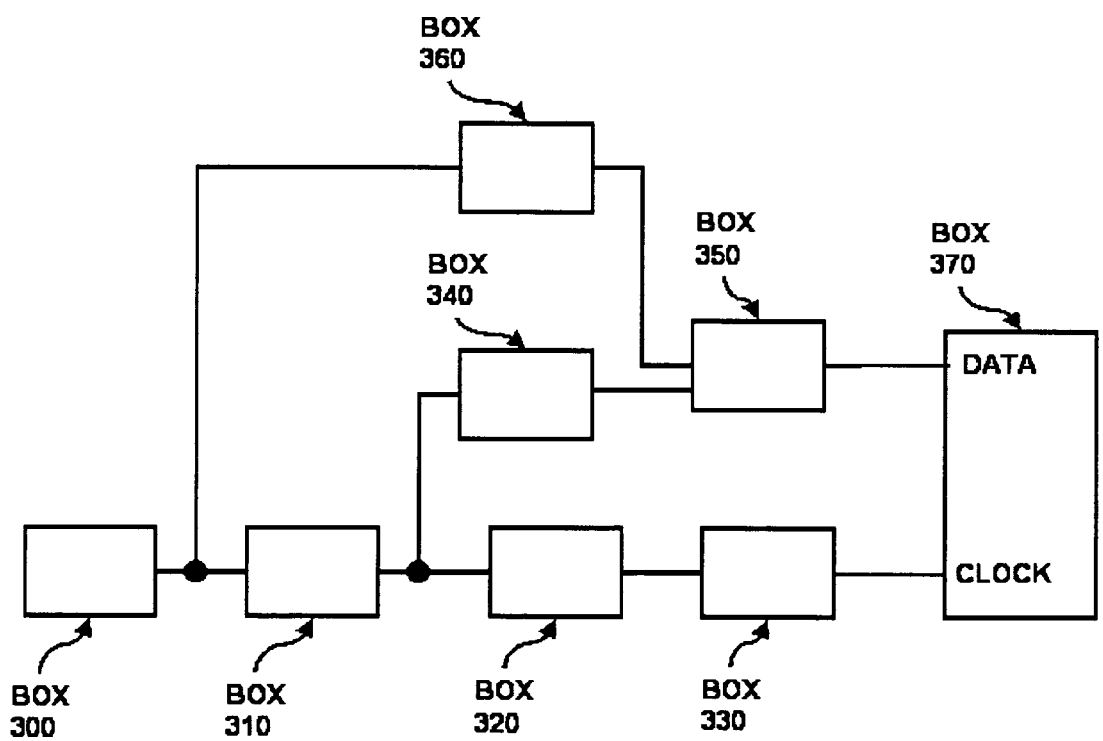
FIG. 3 is a circuit provided for exemplary purposes to illustrate a practical application of the method according to present invention.

In the accompanying example circuit shown in FIG. 3, delays are expressed as a function of global parameters V, W, X, Y, and Z. FIG. 4 depicts the delay for each box in the illustrative circuit as a function of global parameters V, W, X, Y, and Z. In this example, each parameter varies between a minimum and maximum value with a corresponding effect on circuit delay as indicated, although not all the block delays depend on all the parameters.

In the present example, a test at BOX370 is setup such that the DATA input must arrive before the CLOCK input in order for the circuit to operate properly. There are two possible paths leading to the DATA input of BOX370:

DATA input path 1: BOX300, BOX310, BOX340, BOX350, and BOX370

DATA input path 2: BOX300, BOX360, BOX350, BOX370, and there is a path leading to the CLOCK input of BOX370:

CLOCK input path 1: BOX300, BOX310, BOX320, BOX330, BOX370.

In the present example, it is assumed that delays increase with increasing parameter value, similar to the delay dependence on temperature. (Note: it is to be understood that this assumption is for illustration purposes only and is not limiting.) Therefore, for the initial bounded timing analysis, late mode delays are computed using the maximum parameter values, while early mode delays are computed using the minimum parameter values. The setup constraint compares the late mode arrival time at BOX370 DATA input against the early mode arrival time at BOX370 CLOCK input.

Figure 5:
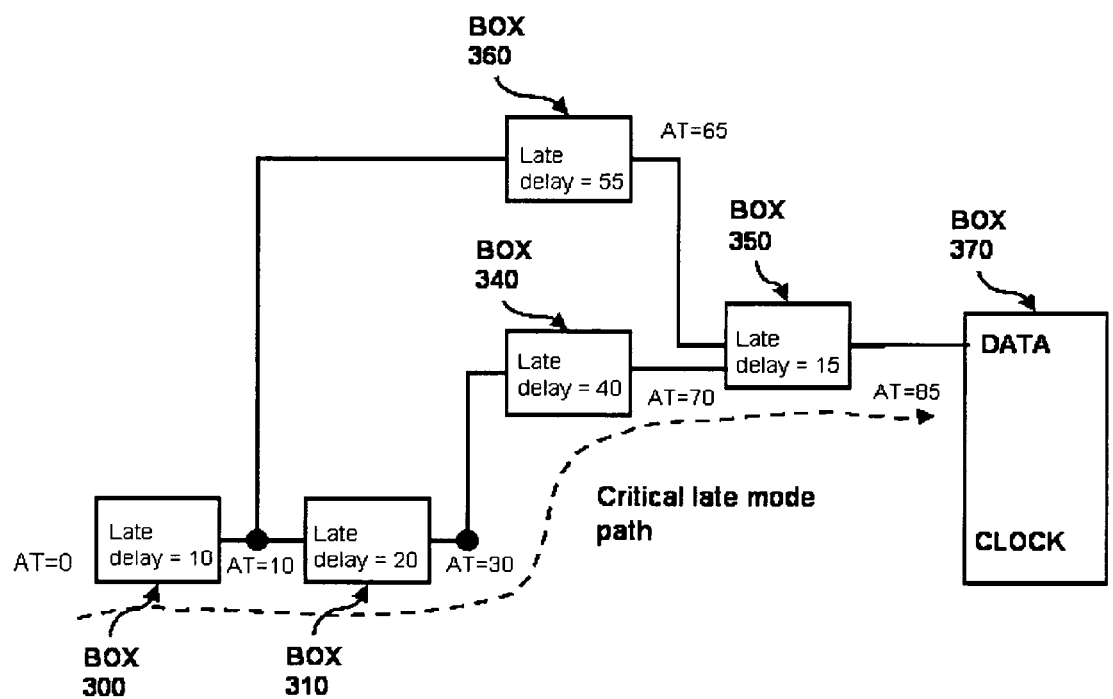
FIGS. 5 and 6, respectively, illustrate bounded late and early mode arrival times for the critical paths in the aforementioned illustrative circuit.

As depicted in FIG. 5, the latest arrival time for BOX370 DATA input corresponding to the BOX300, BOX310, BOX340, BOX350, BOX370 path, the total late mode delay is 85. This is referred to hereinafter as the "critical data path."

Figure 6:
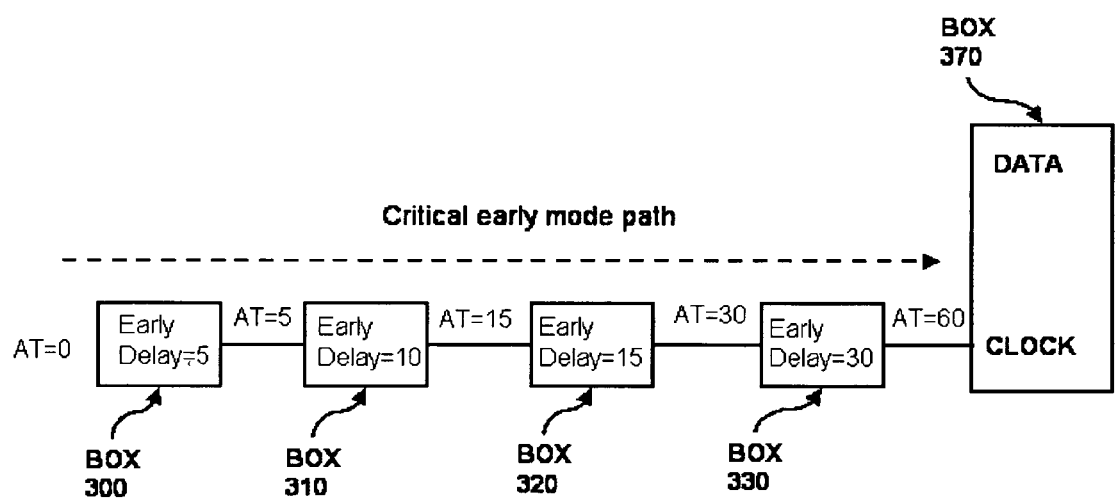

Similarly, in FIG. 6, the earliest arrival time for BOX370 CLOCK input, corresponding to the BOX300, BOX310, BOX320, BOX330, BOX370 path is 60. This is referred to hereinafter as the "critical clock path."

Assuming a zero setup time (the amount of time required for achieving data stability before the clock arrival in order for the circuit to operate properly), the slack for the BOX370 setup test is:

SLACK=60−85=−25

The initial slack computed by using bounding delays is overly pessimistic since inconsistent assumptions have been made regarding the same underlying sources of variation affecting early and late mode paths. In particular, in the illustrative circuit, the late mode delay calculation assumes Vglobal_max, Wglobal_max, Xglobal_max, Yglobal_max, and Zglobal_max, whereas the early mode delay calculation assumes Vglobal_min, Wglobal_min, Xglobal_min, Yglobal_min and Zglobal_min. Clearly, it is physically impossible for these two situations to occur simultaneously. However, it is guaranteed that if the timing test is met under these pessimistic assumptions, it will, likewise, also be met under all process conditions.

In prior art corner-based methods, a full enumeration of all possible parameter combinations is required in order to determine the worst slack per timing constraint. In the illustrative circuit, this involves trying all the combinations of global parameters V, W, X, Y, and Z, namely:

Vglobal_max, Wglobal_max, Xglobal_max, Yglobal_max, Zglobal_max

Vglobal_max, Wglobal_max, Xglobal_max, Yglobal_max, Zglobal_min

Vglobal_max, Wglobal_max, Xglobal_max, Yglobal_min, Zglobal_max

Vglobal_max, Wglobal_max, Xglobal_max, Yglobal_min, Zglobal_min

Vglobal_max, Wglobal_max, Xglobal_min, Yglobal_max, Zglobal_max

Vglobal_max, Wglobal_max, Xglobal_min, Yglobal_max, Zglobal_min

Vglobal_max, Wglobal_max, Xglobal_min, Yglobal_min, Zglobal_max

Vglobal_max, Wglobal_max, Xglobal_min, Yglobal_min, Zglobal_min

Vglobal_max, Wglobal_min, Xglobal_max, Yglobal_max, Zglobal_max

Vglobal_max, Wglobal_min, Xglobal_max, Yglobal_max, Zglobal_min

Vglobal_max, Wglobal_min, Xglobal_max, Yglobal_min, Zglobal_max

Vglobal_max, Wglobal_min, Xglobal_max, Yglobal_min, Zglobal_min

Vglobal_max, Wglobal_min, Xglobal_min, Yglobal_max, Zglobal_max

Vglobal_max, Wglobal_min, Xglobal_min, Yglobal_max, Zglobal_min

Vglobal_max, Wglobal_min, Xglobal_min, Yglobal_min, Zglobal_max

Vglobal_max, Wglobal_min, Xglobal_min, Yglobal_min, Zglobal_min

Vglobal_min, Wglobal_max, Xglobal_max, Yglobal_max, Zglobal_max

Vglobal_min, Wglobal_max, Xglobal_max, Yglobal_max, Zglobal_min

Vglobal_min, Wglobal_max, Xglobal_max, Yglobal_min, Zglobal_max

Vglobal_min, Wglobal_max, Xglobal_max, Yglobal_min, Zglobal_min

Vglobal_min, Wglobal_max, Xglobal_min, Yglobal_max, Zglobal_max

Vglobal_min, Wglobal_max, Xglobal_min, Yglobal_max, Zglobal_min

Vglobal_min, Wglobal_max, Xglobal_min, Yglobal_min, Zglobal_max

Vglobal_min, Wglobal_max, Xglobal_min, Yglobal_min, Zglobal_min

Vglobal_min, Wglobal_min, Xglobal_max, Yglobal_max, Zglobal_max

Vglobal_min, Wglobal_min, Xglobal_max, Yglobal_max, Zglobal_min

Vglobal_min, Wglobal_min, Xglobal_max, Yglobal_min, Zglobal_max

Vglobal_min, Wglobal_min, Xglobal_max, Yglobal_min, Zglobal_min

Vglobal_min, Wglobal_min, Xglobal_min, Yglobal_max, Zglobal_max

Vglobal_min, Wglobal_min, Xglobal_min, Yglobal_max, Zglobal_min

Vglobal_min, Wglobal_min, Xglobal_min, Yglobal_min, Zglobal_max

Vglobal_min, Wglobal_min, Xglobal_min, Yglobal_min, Zglobal_min

Referring now to step 120 of FIG. 2, the inventive method, rather than explicitly trying all the parameter combinations for tests falling below the specified target slack under the initial bounded assumptions, the prior art process of "common path pessimism removal" as described in U.S. Pat. No. 5,636,372 to Hathaway et al. can be used advantageously to calculate the credit for delays common to both the critical clock and the critical data path. For the critical data and clock paths in the elucidatory circuit, the common delays correspond to BOX300 and BOX310. The total common block credit is the difference between the early and late delays for these blocks, which in this example is:

(BOX300 late delay−BOX300 early delay)+
(BOX310 late delay−BOX310 early delay)=
((10−5)+(20−10))=15

The common path credit is added to the initial bounding slack to produce a new slack value:

Common path credit slack=original slack+common path credit.

In the illustrative circuit,

Common path credit slack=−25+15=−10

However, the common path credit slack may still be pessimistic if the non-common portions of the clock and data paths (i.e., that receive no common path credit by prior art methods) are affected by the same underlying parameters.

In the elucidatory circuit of FIG. 3, BOX340 in the late data path and BOX320 in the early clock path depend on parameter X. However, for a late mode delay calculation, the Xglobal_max condition is assumed, whereas for early mode delay calculation, Xglobal_min is specified. Similarly, BOX350 in the late data path, and BOX320 in the early clock path both, depend on global parameter Y, which is still considered in the same bounding fashion. Finally, delays for BOX340 in the late mode data path and BOX330 in the early mode clock path depend on global parameter Z, which is also still considered in the bounding fashion. Since neither BOX340 nor BOX350 nor BOX320 nor BOX330 are physically in common to the critical data and clock paths, the prior art method of common path pessimism removal does not provide any credit for these delays. In the inventive method, if the common path credit is not sufficient to satisfy the target slack (step 130 of FIG. 1), the correlated path pessimism credit is computed according to the procedure in FIG. 2.

Figure 2:
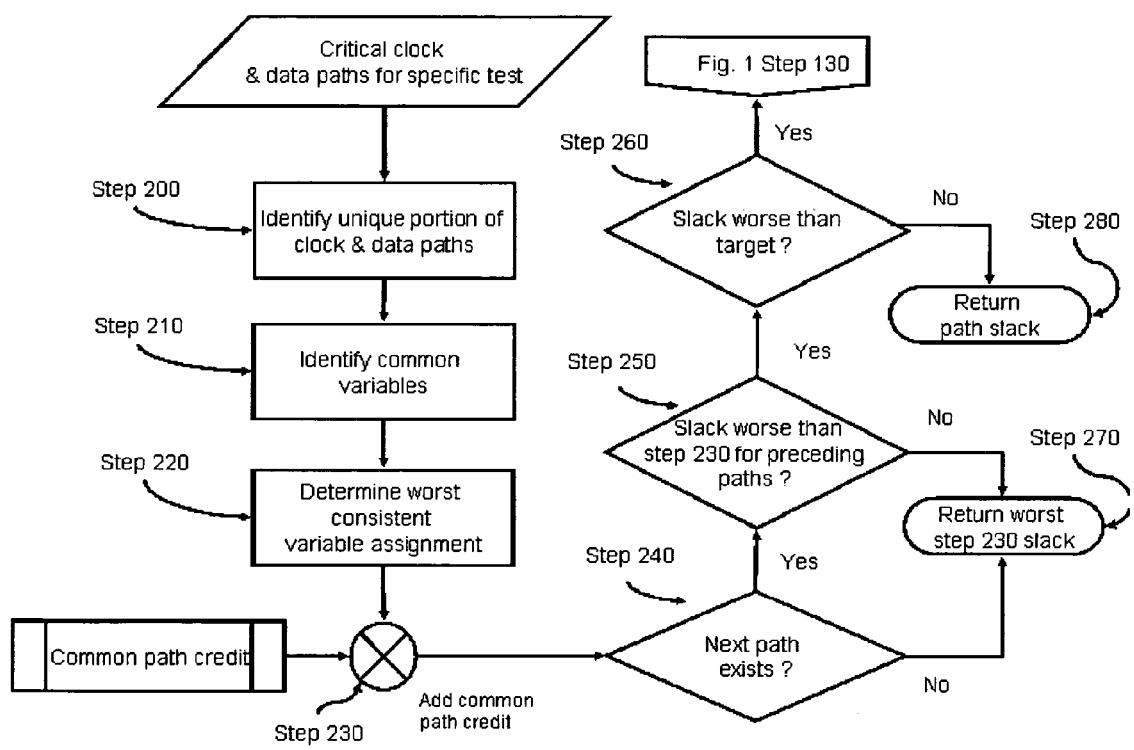
FIG. 2 is a flowchart showing the steps of the inventive method for removing correlated process pessimism.

Referring now to step 200 in FIG. 2, a unique portion of the critical clock and data paths is identified. More specifically, it is the portion of these paths that is not physically common (i.e., that does not pass through the same circuit elements, and hence does not receive a common path pessimism credit of the previous step). In the illustrative circuit, the unique portion of the clock path corresponds to BOX320 and BOX330 and the unique portion of the data path correspond to BOX340 and BOX350.

In step 210, variables that affect delays in both the unique portion of the clock path and unique portion of the data path are identified.

Referring again to the elucidatory circuit, both BOX320 and BOX340 depend on variable X. And in addition, both BOX320 and BOX350 depend on variable Y. Finally, both BOX340 and BOX330 depend on Z. Thus, the common parameters considered here are X, Y, and Z.

In step 220, the worst slack among all consistent variable assignments for the common global parameters is determined.

In a first embodiment of the invention, the unique clock and data paths are re-analyzed for all combinations of common parameter settings.

In the illustrative circuit, the following eight parameter combinations are applied to the unique clock and data paths (BOX320, BOX330) and (BOX340, BOX350)

1. Xglobal_max, Yglobal_max, Zglobal_max
2. Xglobal_max, Yglobal_max, Zglobal_min
3. Xglobal_max, Yglobal_min, Zglobal_max
4. Xglobal_max, Yglobal_min, Zglobal_min
5. Xglobal_min, Yglobal_max, Zglobal_max
6. Xglobal_min, Yglobal_max, Zglobal_min
7. Xglobal_min, Yglobal_min, Zglobal_max
8. Xglobal_min, Yglobal_min, Zglobal_min For parameters which are not common to both, the unique data and clock paths (in the illustrative circuit, W and V) are left in their initial bounding state.

For each of the aforementioned combinations, a new test slack is computed by propagating the original arrival times from the closest common clock/data point (in the illustrative circuit, it corresponds to BOX310) through the unique portion of the data and clock paths using delays computed as described above. The original common path credit is then added to the minimum of all the slack values to generate the worst consistent slack for the critical data and clock paths.

In the illustrative circuit, using delays from FIG. 4, the eight combinations listed above generate the following slack values, not including the original common path credit:

1. ((15+30+40)−(30+40+15))=85−85=0
2. ((15+30+30)−(30+30+15))=75−75=0
3. ((15+20+35)−(30+40+10))=70−80=−10
4. ((15+20+30)−(30+30+10))=65−70=−5
5. ((15+25+35)−(30+30+15))=75−75=0
6. ((15+25+30)−(30+20+15))=70−65=+5
7. ((15+15+35)−(30+30+10))=65−70=−5
8. ((15+15+30)−(30+20+10))=60−60=0

The minimum slack value among these combinations is −10, corresponding to the Xglobal_max, Yglobal_min, Zglobal_max parameter setting. The common path credit (15) is then added (step 230 of FIG. 2) to produce a final slack value of +5.

An alternate method is to terminate the analysis of a given clock and data path pair once a consistent parameter combination is identified for which the original common path credit added to resulting slack is below the slack target.

In a second embodiment of the invention, consistent corners are selected for a limited set of parameters, e.g., those having the largest impact on delay, while the others remain in a bounded state. If the resulting slack is above the target slack, no further exploration of parameter combinations for the current path-pair is required; otherwise, additional variables may be successively explored until the slack threshold is met.

In the illustrative circuit, for the first critical data path, an initial expansion for parameter X considers the following combinations:

Data path: Xglobal_min, Yglobal_max, Zglobal_max
versus
Clock path: Xglobal_min, Yglobal_min, Zglobal_min
Data path: Xglobal_max, Yglobal_max, Zglobal_max
versus Clock path: Xglobal_max, Yglobal_min, Zglobal_min
The Xglobal_min combination resulting in a non-negative slack is computed as follows:

((15+15+30)−(30+30+15))=−15

Slack including common path credit=−15+15=0

Since this slack meets the specified threshold '0', no further analysis of parameter combinations involving Xglobal_min is required. However, the Xglobal_max combination produces a negative slack computed as follows:

((15+20+30)−(30+40+15))=−20

Slack including common path credit=−20+15=−5

In this case, a further expansion of the next parameter (Y) is performed for the Xglobal_max parameter setting. This considers the following additional corners:
Data path: Xglobal_max, Yglobal_max, Zglobal_max
versus
Clock path: Xglobal_max, Yglobal_max, Zglobal_min
Data path: Xglobal_max, Yglobal_min, Zglobal_max
versus
Clock path: Xglobal_max, Yglobal_min, Zglobal_min
The Xglobal_max, Yglobal_max combination results in a positive slack computed as follows:

((15+30+30)−(30+40+15))=−10

Slack including common path credit=−10+15=+5

The Xglobal_max, Yglobal_min also results in a non-negative slack, computed as follows:

((15+20+30)−(30+40+10))=−15.

Slack including common path credit=−15+15=0

Since both combinations are non-negative, no further parameter combination for this path-pair needs to be explored.

Note that in the illustrative circuit, by using the successive expansion embodiment of the inventive method, only four parameter combinations needed to be explored, which is less than total number of possible permutations 8 among the three local variables, and far less than prior art methods requiring full exploration of all 32 possible corners.

An alternate method is to terminate such successive variable expansion after a specified number of parameters have been considered. This produces a conservative bound on the path-pair slack but still provides some credit due to correlation. In the illustrative circuit, for example, if only one parameter is allowed for expansion, the most critical slack after the first expansion, in this case −5, is used to represent the critical data and critical clock path slack.

In a third embodiment of the invention, parameters that have a separable impact on delay are projected independently to a worst-case corner. Linear complexity per path is guaranteed for the variables which are separable, unlike previous embodiments, wherein exponential complexity is still possible in the worst case (i.e., if each parameter expansion produces a slack below the specified cutoff).

For the critical data and clock paths in the illustrative circuit, parameter X is assigned a value based on the worst slack among:
Xglobal_max (all other parameters bounded)
Data path: Xglobal_max, Yglobal_max, Zglobal_max
Clock path: Xglobal_max, Yglobal_min, Zglobal_min Slack=((15+20+30)−(30+40+15))=−20 and
Xglobal_min (all other parameters bounded)
Data path: Xglobal_min, Yglobal_max, Zglobal_max
Clock path: Xglobal_min, Yglobal_min, Zglobal_min Slack=((15+15+30)−(30+30+15))=−15

In the present example, a consistent assignment of Xglobal_max generates the worst slack. Parameter Y is then assigned a value in a similar fashion by considering the combinations
Yglobal_max (Xglobal_max from previous step, Z bounded)
Data path: Xglobal_max, Yglobal_max, Zglobal_max
Clock path: Xglobal_max, Yglobal_max, Zglobal_min.

Slack=((15+30+30)−(30+40+15))=−10 and
Yglobal_min (Xglobal_max from previous step, Z bounded)
Data path: Xglobal_max, Yglobal_min, Zglobal_max
Clock path: Xglobal_max, Yglobal_min, Zglobal_min.

Slack=((15+20+30)−(30+40+10))=−15

In this example, a consistent assignment of Yglobal_min produces the worst slack. Finally, parameter Z is assigned a value based on the worst of:
Zglobal_max (Xglobal_max and Yglobal_min from previous)
Data path: Xglobal_max, Yglobal_min, Zglobal_max
Clock path: Xglobal_max, Yglobal_min, Zglobal_max.

Slack=((15+20+35)−(30+40+10))=−10 and
Zglobal_min (Xglobal_max and Yglobal_min from previous).
Data path: Xglobal_max, Yglobal_min, Zglobal_min
Clock path: Xglobal_max, Yglobal_min, Zglobal_min.

Slack=((15+20+30)−(30+30+10))=−5

The common path credit (15) is added to the worst parameter combination (Xglobal_max, Yglobal_min, Zglobal_max) slack (−10) to produce a final path slack value of (+5).

Alternatively, if sensitivities or incremental delays with respect to each parameter are available, one may collect sensitivities on a round-trip path basis, (i.e., by adding the sensitivities in the data path, and subtracting the sensitivities in the clock path) to immediately project the worst consistent setting per variable.

Referring now to step 240 of FIG. 2, parameters are set back to their initial bounding state and the next critical data path leading to the current test is enumerated.

In the illustrative circuit, for example, as depicted in FIG. 7, the next critical path is: BOX300, BOX3600, BOX350, BOX370 producing a late mode arrival time at BOX170 DATA input of 80.

Referring now to step 250 of FIG. 2, the slack corresponding to the next critical data path is computed and compared against the worst slack among all preceding paths in step 230.

In the illustrative circuit, the next critical data path slack is:

SLACK=60−80=−20

This indeed is worse than the previous computed path-slack value of +5.

Referring to step 260, if the resulting slack does not meet the slack target, the procedure repeats for the next critical data path.

In the illustrative circuit, the common path credit for the next critical data path is +5. Since the resulting slack (−20+5=−15) is less than the slack target '0', steps 120 through 140 are performed. In this case, the unique data path is BOX360, BOX350, and the unique clock path is BOX310, BOX320, and BOX330. There is only one common variable (Y), and the worst consistent slack for this path occurs for the Yglobal_max parameter setting. The worst slack in this case is:

((5+10+15+30)−(10+55+15))=60−80=−20

Slack including common path credit=−20+5=−15

In the illustrative circuit, there are no additional data paths, and the worst path slack from step 230 is −15. Therefore, the setup test at BOX370 is marked as a violation (since this is less than the target slack of zero).

An alternate method is to terminate the procedure described in FIG. 2 once step 230 produces a slack below the target value (since at this point it can be determined the test will be a violation since at least one path slack is below the target).

In yet another alternate method, the inventive method terminates after a specified number of paths is considered, generating an upper bound on the slack value.

A specific application of the invention is to apply these methods to all timing tests in a given design which initially do not meet the target slack under bounded timing conditions. Another specific application is to sort tests based on initial slack, apply the inventive method for each test in sorted order (starting with the worst slack) and terminate as soon as the slack so produced for one such test does not meet the specified target.

The inventive method can be advantageously applied (but not limited) to: a) gate or transistor-level timing; b) several forms of delay/slew/load calculation, including simulation, and/or equation or table-based lookup; c) gate and wire delay variations; d) rise and fall delays; e) multiple clock-domains; f) clocking configurations, including trees, meshes, hybrid tree/meshes, gated clocks, and pulsed clocking; g) circuits with different types of storage elements (edge or level-sensitive); h) variations between different families of devices with different threshold voltages or gate oxide thicknesses and i) macro, chip, and/or system level designs. It may also be applied to early vs. late path timing tests in which neither the early nor late path is a clock path, e.g., in self-timed systems.

Whereas the present invention has been described in terms of several preferred embodiments, it will be understood by those skilled in the art that numerous changes and modifications to the algorithm may be introduced without departing from the spirit of the invention. Accordingly, the present invention is intended to embrace all such alternatives which fall within the scope of the appended claims.

What is claimed and desired to be secured by Letter Patents is:

1. A method for performing static timing analysis of a digital system in the presence of a plurality of global sources of delay variation comprising the steps of:
   a) selecting, for at least one timing test, at least one pair of an early path and a late path leading to said timing test;
   b) identifying at least one global parameter which the delays of said early and late paths depend on, and identifying parameters in which delay functions are separable;
   c) determining for at least one of said global parameters at least one consistent value assignment, and setting independently each of said parameters in which delay function are separable from a value that results in a worst slack value at said timing test; and
   d) computing for each said consistent assignment a slack value for said path pair.

2. The method as recited in claim 1 wherein one of said early and late paths is a clock path and the other of said early and late paths is a data path.

3. The method as recited in claim 1, wherein said at least one timing test comprises those timing tests within said digital system whose slack falls below a specified threshold after an initial static timing analysis.

4. The method as recited in claim 1, wherein said identified path pair comprises a late critical path to said timing test and an early critical path to said timing test.

5. The method as recited in claim 1, wherein said initial static timing analysis is performed using bounding parameter values.

6. The method as recited in claim 1, further comprising the step of determining for each of said timing tests the worst of said computed slacks.

7. The method as recited in claim 6, further comprising the step of determining whether the slack of any other early and late path pair to said timing test is worse than said determined worst slack, and if so, repeating said steps b), c), and d) for said other path pair.

8. The method as recited in claim 1, wherein said step c) further comprises the steps of:
   e) enumerating combinations of realizable values of at least one of said identified parameters; and
   f) performing a timing analysis for each of said enumerated combinations.

9. The method as recited in claim 8, wherein said step e) is terminated after one of the timing analyses of step f) produces a slack below a specified threshold.

10. The method as recited in claim 8, wherein at least one parameter whose realizable values are enumerated comprises a subset of the parameters identified in step b).

11. The method as recited in claim 10, wherein said step e) is repeatedly applied to additional ones of said identified parameters until said step f) results in a slack which is greater than a specified slack threshold.

12. The method as recited in claim 1, wherein said step of independently setting parameter values further comprises the steps of:
   e) summing along the early and late paths of said path pair sensitivities of delay elements with respect to each of said parameters in which delay functions are separable;
   f) computing the difference between said summed path sensitivities of said early and late paths, and
   g) determining a value of each of said parameters in which delay functions are separable according to an arithmetic sign of said difference of sensitivities.

13. The method as recited in claim 1, wherein the timing analysis is performed at a gate-level.

14. The method as recited in claim 1, wherein the timing analysis is performed at a transistor-level.

15. The method as recited in claim 1, wherein the delay models are stored as pre-determined tables.

16. The method as recited in claim 1, wherein the delay models are stored as pre-determined analytic equations.

17. The method as recited in claim 1, wherein the delay models are computed on the fly.

18. The method as recited in claim 1, wherein the circuit comprises a plurality of clock domains.

19. The method as recited in claim 1, wherein the circuit is selected from the group consisting of at least one of the following clock configurations: mesh network, tree network, hybrid network, gated clocks and pulsed clocks.

20. The method as recited in claim 1, wherein the sources of variability include a mistrack between one or more of the following device families that is selected from the group consisting of devices having different threshold voltages, devices having different gate oxide thicknesses and devices having different characteristics for PFET and NFET devices.

21. The method as recited in claim 1, wherein the sequential elements are selected from the group consisting of at least one of: master-slave latches, flip-flops, edge-triggered latches, level-sensitive latches and transparent latches.

22. The method as recited in claim 1, wherein the timing analysis is conducted for timing verification at one or more levels selected from the group consisting of a circuit level, macro level, functional-unit level, chip level, board level and system level.

23. The method as recited in claim 1, wherein the circuit being analyzed is selected from the group consisting of at least one of the following technologies: CMOS, domino, static logic and dynamic logic.

24. The method as recited in claim 1, wherein the global sources of variation include one or more of manufacturing variations, device fatigue variations, environmental variations, modeling variations, and circuit operation variations.

25. A system for performing static timing analysis of a digital system in the presence of a plurality of global sources of delay variation comprising:
   a) means for selecting, for at least one timing test, at least one pair of an early path and a late path leading to said timing test;
   b) means for identifying at least one global parameter which the delays of said early and late paths depend on, and mean for identifying parameters in which delay functions are separable;
   c) means for determining for at least one of said global parameters at least one consistent value assignment and means for setting dependently each of said parameters in which delay functions are separable to value that results in a worst slack value at said timing test; and
   d) means for computing for each said consistent assignment a slack value for said path pair.

26. The system as recited in claim 25, wherein element c) further comprises:
   e) means for enumerating combinations of realizable values of at least one of said identified parameters; and
   f) means for performing a timing analysis for each of said enumerated combinations.

27. The system as recited as recited in claim 26, wherein said means of independently setting parameter values further comprises:
   e) means for summing along the early and late paths of said path pair sensitivities of delay elements with respect to each of said parameters in which delay functions are separable;
   f) means for computing the difference between said summed path sensitivities of said early and late paths, and
   g) means for determining a value of each of said parameters in which delay functions are separable according to an arithmetic sign of said difference of sensitivities.

28. A program storage device readable by a machine, tangibly, embodying a program of instructions executable by the machine to perform method steps for performing static timing analysis of a digital system in the presence of a plurality of global sources of delay variation, said method steps comprising:
   a) selecting, for at least one timing test, at least one pair of an early path and a late path leading to said timing test;
   b) identifying at least one global parameter which the delays of said early and late paths depend on, and identifying parameters which delay functions are separable;
   c) determining for at least one of said global parameters at least one consistent value assignment, and setting independently each of said parameters in which delay functions are separable to a value that results in a worst slack value at timing test
   d) computing for each said consistent assignment a slack value for said path pair.

* * * * *